United States Patent [19]
Graeme

[11] 3,760,199
[45] Sept. 18, 1973

[54] FET ZERO TEMPERATURE-COEFFICIENT BIAS

[75] Inventor: Jerald G. Graeme, Tucson, Ariz.

[73] Assignee: Burr-Brown Research Corporation, Tucson, Ariz.

[22] Filed: Sept. 11, 1972

[21] Appl. No.: 287,775

[52] U.S. Cl. .................. 307/296, 307/310
[51] Int. Cl. .................. H03k 1/00
[58] Field of Search .................. 307/221, 251, 279, 307/304, 296, 310

[56] References Cited

UNITED STATES PATENTS

| | | | |
|---|---|---|---|
| 3,414,739 | 12/1968 | Paidosh | 307/310 |
| 3,560,768 | 2/1971 | Rimkus | 307/310 |
| 3,210,561 | 10/1965 | Ullman | 307/296 |
| 3,505,539 | 4/1970 | Pleshko | 307/296 |

*Primary Examiner*—John W. Huckert
*Assistant Examiner*—R. E. Hart
*Attorney*—William C. Cahill et al.

[57] ABSTRACT

Compensatory circuitry is disclosed for developing biasing voltage sources, which sources are adjusted to conform with temperature sensitive variations and manufacturing variations of junction field effect transistors, and thereby consistently produce a zero temperature coefficient bias. The pinchoff voltage of junction field effect transistors varies with temperature and must be compensated by an equal and opposite compensating voltage. The pinchoff and compensatory voltages are developed and the combination of the two will provide a zero temperature coefficient bias voltage by providing a stable bias to the junction field effect transistor resulting in a drain current equivalent to the drain current at the zero temperature coefficient point.

10 Claims, 2 Drawing Figures

FET ZERO TEMPERATURE-COEFFICIENT BIAS

The present invention relates to compensatory circuitry, and more particularly, to circuitry for producing the zero temperature coefficient bias for junction field effect transistors.

A basic characteristic of junction field effect transistors is that they are highly temperature sensitive unless biased at their zero temperature coefficient point. Under present fabrication processes, junction field effect transistors of the same type may have a 4 to 1 range in the drain current or the gate-source voltage at the zero temperature coefficient point. Thus, it is common practice to sort the junction field effect transistors of the same type into sub-groups where each sub-group has a small range of current and voltage variation. However, the number of sub-groups becomes an impractical solution when very accurate and consistent zero temperature coefficient bias is mandatory. Where a junction field effect transistor is used in a monolithic integrated circuit form, the above described pre-sorting is not practical.

It is therefore a primary object of the present invention to develop a zero temperature coefficient bias for junction field effect transistors.

Another object of the present invention is to compensate for manufacturing variations to consistently produce a zero temperature coefficient bias for junction field effect transistors.

Yet another object of the present invention is to provide an accurate approximation of the zero temperature coefficient bias for junction field effect transistors.

A further object of the present invention is to provide a zero temperature coefficient bias for junction field effect transistors in monolithic integrated circuit forms.

These and other objects of the present invention will become apparent to those skilled in the art as the description thereof proceeds.

The present invention may be understood with more specificity and clarity with reference to the following figures, in which.

Figure 1:
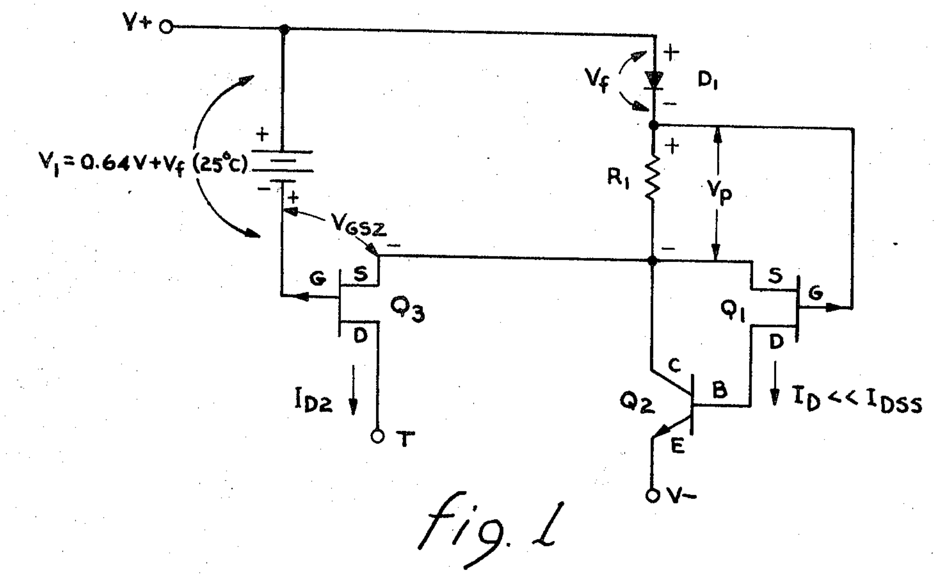
FIG. 1 illustrates a circuit incorporating the teachings of the present invention.

The junction field effect transistor (JFET) may be used to greatly simplify DC amplifier circuitry where a solid state approach with high input resistance is necessary. JFET's also have the very convenient capability of being biased in a condition which produces almost a zero temperature coefficient. The drain current for JFET's varies with temperature for every possible gate bias voltage except that voltage corresponding to the zero temperature coefficient point. For higher gate voltages, the drain current increases in temperature for a positive temperature coefficient. Smaller values of gate voltage produce a negative temperature coefficient with the drain current decreasing with increasing operating temperature. At the zero temperature coefficient point, however, the drain current remains constant even though the temperature is varied, or, the temperature coefficient is practically zero.

Two opposing effects are present which affect the temperature coefficient in opposite ways. The first effect is due to a variation in the barrier or contact potential which has a negative thermal sensitivity of about 2.2 milivolts per degree centigrade, resulting in a positive temperature coefficient for the drain current when the gate voltage is held constant. The second effect is due to the change in resistivity of the material in the channel and results in a negative temperature coefficient for the drain current.

The variation of the drain current due to the barrier potential is a function of the transconductance of the JFET divided by the drain current and is greatest for JFET's having a low pinchoff voltage. For JFET's with a very low value of pinchoff voltage, this effect dominates and the net temperature coefficient of the drain current will be positive. If the value of the pinchoff voltage for a JFET is very high, then the variation in barrier potential will produce very little variation in drain current and the net effect will be dominated by the change in resistivity resulting in a net negative temperature coefficient. JFET's having an intermediate value of pinchoff voltage may have a drain current temperature coefficient which is either positive or negative, depending upon the bias condition. At one critical value of the gate-source voltage, the temperature coefficient is zero.

Theoretical analysis indicates that this zero temperature coefficient bias point occurs when the ratio $I_D/g_{fs}$ (drain current divided by the transconductance) is equal to approximately 0.32 volts. Combining the above requirement with the normal theoretical characteristic equations for JFET's, one can derive the theoretical value of either the gate voltage or drain current required to yield the optimum bias point for *n* channel JFET's by the following equations:

$$V_{GSZ} \cong V_p + 0.64\text{V},$$

and $$I_{DZ} \cong I_{DSS}\,[0.64/V_p]^2$$

Where:

$V_{GSZ}$ is equal to the gate-source voltage at the zero temperature coefficient point, $V_p$ is equal to the pinchoff voltage, $I_{DZ}$ is equal to the drain current at the zero temperature coefficient point, and $I_{DSS}$ is equal to the zero biased drain current.

Thus, the $V_{GSZ}$ of a JFET can be described in terms of its pinchoff voltage characteristic, or, $V_{GSZ} \cong V_p + 0.64\text{V}$ at 25°C for *n* channel JFET's.

Thus, analogously for *p* channel JFET's $V_{GSZ} \cong V_p - 0.64\text{V}$ at 25°C.

As the above relationships are temperature variable, the voltage of the thermally sensitive $V_p$ term must be compensated by changes in the term shown as a constant in order to maintain a constant $V_{GSZ}$. If one defines the compensating term as $V_c$, the above relationship can be written as:

$$V_{GSZ} \cong V_p + V_c$$

To consider the thermal compensation required from $V_c$, the above equation is differentiated with respect to temperature *T*. The derivative of temperature independent term $V_{GSZ}$ is 0 and the differentiated equation becomes:

$$dV_{GSZ}/dT = 0 \cong (dV_p/dT) + (dV_c/dT)$$

From this result, the needed temperature dependence for $V_c$ is:

$$dV_c/dT = -(dV_p/dT)$$

If a first voltage source can be developed which produces a voltage equal to $V_p$ and if a second voltage source can be developed for the compensation term, $V_c$, then, the combination of the two voltage sources will provide the zero temperature coefficient bias, $V_{GSZ}$.

Referring to FIG. 1, there is shown a circuit which produces the needed voltage sources ($V_p$ and $V_c$) defined above. Briefly, the circuit includes the following arrangement of elements. The anode of a diode D-1 is connected to a positive potential source $V+$. The cathode of diode D-1 is connected to the gate of a JFET Q-1. A resistor R-1 is connected across the cathode of diode D-1 and the source of JFET Q-1. The drain of JFET Q-1 is connected to the base of a NPN transistor Q-2. The emitter of transistor Q-2 is connected to a negative potential source V−, and the collector of transistor Q-2 is connected to the junction of the JFET Q-1 source and resistor R-1. A second JFET, Q-3, has its source connected to the source of JFET Q-1. The drain of JFET Q-3 is connected to an output terminal *T*. The gate of JFET Q-3 is connected to the negative terminal of a bias voltage source V-1. Bias voltage source V-1 is of a value equal to 0.64 *V* plus the voltage $V_f$ across the diode D-1 at a temperature of 25°C. The positive terminal of bias voltage source V-1 is connected to potential source $V+$.

The above-mentioned voltage source, $V_c$, is formed by bias voltage V-1 and the temperature variable voltage $V_f$ across diode D-1. The above-mentioned voltage source, $V_p$, is developed across resistor R-1 by the combination of JFET Q-1, transistor Q-2, and resistor R-1. The feedback current from transistor Q-2 to JFET Q-1 forces the drain current, $I_D$, of JFET Q-1 to be a small base current for transistor Q-2. The drain current, $I_D$, is much smaller than the zero biased drain current $I_{DSS}$. As a result, the gate-source voltage $V_{GS}$ of JFET Q-1 will be very nearly equal to the desired voltage $V_p$.

The compensation voltage $V_c$, formed by the combination of voltage V-1 and the voltage across diode D-1, $V_f$, must compensate for the thermally induced voltage variation of $V_p$. The thermally induced voltage variation is due to an inherent characteristic of junction semiconductors. The voltage across forward and reverse biased semiconductor junctions is a temperature dependent variable with the voltage varying inversely across a forward biased junction as compared to the voltage varying across a reverse biased junction.

A temperature variation of the circuit shown in FIG. 1 creates a voltage change on a forward biased junction, such as the voltage $V_f$ across diode D-1, that is equal and opposite to the voltage change on the reverse bias JFET junction, $V_p$. This is precisely the compensation called for by the equation above. Thus, the bias is varied by the voltage $V_f$ and the resultant bias voltage is compensated for the variation of voltage $V_p$ across resistor R-1.

The combination of these two voltages, $V_c$ and $V_p$, provides a stable bias to JFET Q-3 that will be the required gate-source voltage at the zero temperature coefficient point ($V_{GSZ}$) for that JFET. The drain current $I_D$ of JFET Q-3 is then at the zero temperature coefficient level.

To achieve the zero temperature coefficient bias, it is only necessary to have the pinchoff voltages $V_p$ of JFET Q-1 and JFET Q-3 matched. This match is achieved by a simple testing of individual JFET's and is automatically provided in monolithic integrated circuits by the simultaneous fabrication of two identical JFET's. As long as the pinchoff voltage $V_p$ match is provided, the gate source bias provided to JFET Q-3 will be adjusted despite the process variations of the particular JFET's involved and affecting the zero temperature coefficient bias point. Thus, the present invention obviates the need to adjust bias to the zero temperature coefficient points of JFET's.

Figure 2:
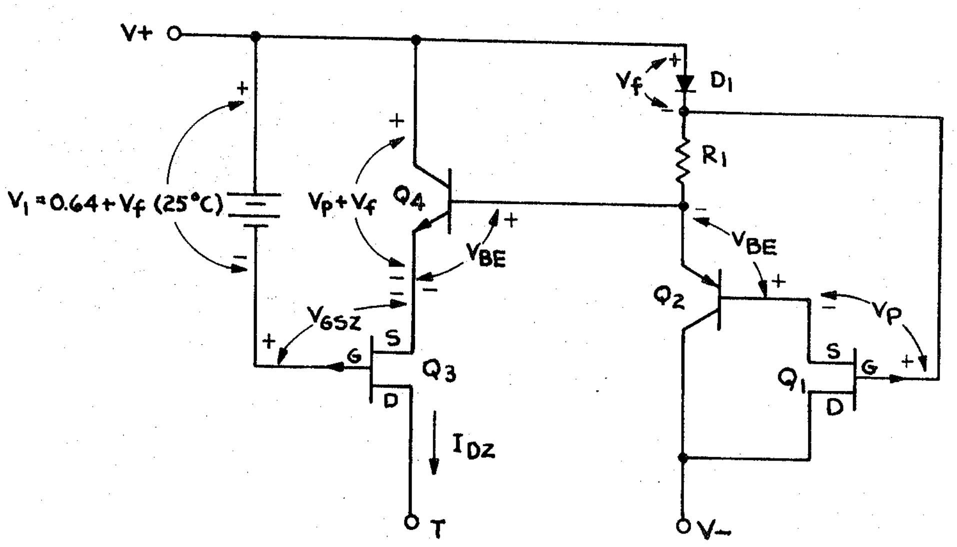
FIG. 2 illustrates a modified circuit incorporating the teachings of the present invention.

Referring to FIG. 2, there is illustrated a modification of the circuit shown in FIG. 1. The source of JFET Q-1 is connected to the base of PNP transistor Q-2. The emitter of transistor Q-2 is connected to resistor R-1. The collector of transistor Q-2 is connected to the drain of JFET Q-1 and to the negative potential source $V-$. The junction between resistor R-1 and the emitter of transistor Q-2 is connected to the base of NPN transistor Q-4, the latter acting as an emitter follower. The collector of transistor Q-4 is connected to positive potential source $V+$. The emitter of transistor Q-4 is connected to the source of JFET Q-3.

In this circuit, the feedback connection of JFET Q-1 and transistor Q-2 sets the gate-source voltage $V_{GS}$ of Q-1 at the pinchoff voltage $V_p$. The compensating voltage $V_c$ is again formed by the combination of bias voltage V-1 and the voltage across diode D-1, $V_f$. The source of JFET Q-3, however, is biased by the emitter follower buffer Q-4. The voltage of the source of JFET Q-3 is approximately equal to the pinchoff voltage, $V_p$, plus the voltage across the diode, $V_f$. The gate voltage of JFET Q-3 is equal to the bias voltage source V-1. In operation, the voltage source V-1 remains constant despite temperature changes. In order for the gate-source voltage to be constant at the zero temperature coefficient point, the source bias of $V_p + V_f$ must also be constant. The terms $V_p$ and $V_f$ will vary with temperature, but the variation of each term is opposite to that of the other term. Thus, the net change is zero and results in a constant potential value at the source of JFET Q-3. With potential at both the gate and source of JFET Q-3 remaining constant, the voltage thereacross remains constant and is equal to the gate-source voltage at the zero temperature coefficient, $V_{GSZ}$.

As the drain current $I_D$ is dependent upon the gate-source voltage, $V_{GS}$, and the latter is at the zero temperature coefficient level, the drain current is also at the zero temperature coefficient point.

Exemplary uses of the above-described circuits include the following. The circuits shown in FIGS. 1 or 2 can be used to voltage bias a JFET with the gate-source voltage at the zero temperature coefficient point or by the drain current at the zero temperature coefficient level. In the voltage biased case, JFET Q-3 represents the signal carrying JFET and the input signal would modulate the bias voltage V-1. In the current biased case, JFET Q-3 is used as a current source to set the quiescent current in the signal carrying JFET.

While the principles of the invention have now been made clear in an illustrative embodiment, there will be immediately obvious to those skilled in the art many modifications of structure, arrangement, proportions, the elements, materials, and components, used in the practice of the invention which are particularly adapted for specific environments and operating requirements without departing from those principles.

I claim:

1. Compensatory circuitry for biasing a field effect transistor at the zero temperature coefficient bias, said circuitry comprising in combination:

a. a first and second field effect transistor, each said field effect transistor having a drain, a source, and a gate;

b. a potential source connected to the gate of said first field effect transistor through a forward semiconductor junction, the voltage drop across said junction being temperature dependent;

c. means for providing feedback between the source and drain of said first field effect transistor;

d. means disposed between said junction and the source of said first field effect transistor for developing a temperature dependent voltage;

e. a bias potential source disposed between said potential source and the gate of said second field effect transistor, the value of said bias potential source being temperature independent;

f. means for biasing the source of said second field effect transistor with the voltage developed across said resistor; and g. an output terminal connected to the drain of said second field effect transistor, whereby the compensatory effect of said bias potential source cooperating with the temperature dependent voltage applied to the source of said second field effect transistor by said biasing means produces an output current at the zero temperature coefficient point of said second field effect transistor.

2. The circuitry as set forth in claim 1, wherein said junction comprises a diode and said developing means comprises a resistor.

3. The circuitry as set forth in claim 2, wherein said means for providing feedback comprises a transistor.

4. The circuitry as set forth in claim 3, wherein said transistor includes:

a. a base connected to the drain of said field effect transistor;

b. a collector connected to the source of said field effect transistor; and c. an emitter connected to a further potential source.

5. The circuitry as set forth in claim 2, wherein said bias potential source includes a voltage equivalent to the voltage drop across said diode at room temperature.

6. The circuitry as set forth in claim 3, wherein said transistor includes:

a. a base connected to the source of said first field effect transistor;

b. an emitter connected to said resistor;

c. a collector connected to the drain of said first field effect transistor and another potential source.

7. The circuitry as set forth in claim 6, wherein said biasing means comprises an emitter follower buffer disposed between said resistor and the source of said second field effect transistor.

8. The circuitry as set forth in claim 1, wherein said first field effect transistor is in pinchoff.

9. Compensatory circuitry for biasing a field effect transistor at zero temperature coefficient bias, including a potential source, said circuitry comprising in combination:

a. a first and second field effect transistor, each said field effect transistor having a drain, a source, and a gate;

b. means for providing feedback between the source and drain of said first field effect transistor to develop a voltage source equal to the pinchoff voltage;

c. a compensating bias voltage derived from the forward biased voltage of a semiconductor junction;

d. a temperature independent constant voltage bias applied to said second field effect transistor;

e. means for combining said pinchoff voltage source with said compensating bias voltage, and said constant voltage bias; whereby the combination produces a voltage which is the zero temperature coefficient bias of said second field effect transistor.

10. The circuitry as set forth in claim 1, wherein:

a. said compensating bias voltage is produced by a forward biased diode disposed between the potential source and the gate of said first field effect transistor;

b. a resistor is disposed between said diode and the source of said first field effect transistor for developing said pinchoff voltage;

c. said constant voltage bias being disposed intermediate the potential source and the gate of said second field effect transistor.

d. means for applying the voltage developed across said resistor and said diode at the source of said second field effect transistor; and e. an output terminal connected to the drain of said second field effect transistor, whereby the compensatory effect of said bias potential source cooperating with the temperature dependent voltage applied to the source of said second field effect transistor by said biasing means produces an output current at the zero temperature coefficient point of said second field effect transistor.

* * * * *